United States Patent
Lee

(10) Patent No.: US 7,768,327 B2
(45) Date of Patent: Aug. 3, 2010

(54) DELAY LOCKED LOOP OF SEMICONDUCTOR DEVICE AND METHOD FOR DRIVING THE SAME

(75) Inventor: Hye-Young Lee, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 62 days.

(21) Appl. No.: 11/819,818

(22) Filed: Jun. 29, 2007

(65) Prior Publication Data

US 2008/0100354 A1    May 1, 2008

(30) Foreign Application Priority Data

Oct. 31, 2006    (KR) .................... 10-2006-0106765

(51) Int. Cl.
*H03L 7/06* (2006.01)

(52) U.S. Cl. ........................... 327/158; 327/175

(58) Field of Classification Search ............... 327/147, 327/156–159, 172–176, 149–150; 375/373–376; 331/1 R See application file for complete search history.

(56) References Cited

U.S. PATENT DOCUMENTS

| | | | |
|---|---|---|---|
| 6,271,697 B1 * | 8/2001 | Hayashi et al. | 327/158 |
| 6,853,225 B2 | 2/2005 | Lee | |
| 6,859,081 B2 | 2/2005 | Hong et al. | |
| 6,956,418 B2 * | 10/2005 | Kwak et al. | 327/158 |
| 6,963,235 B2 | 11/2005 | Lee | |
| 7,042,265 B2 * | 5/2006 | Harrison | 327/271 |
| 7,288,977 B2 * | 10/2007 | Stanley | 327/172 |
| 7,403,055 B2 * | 7/2008 | Minzoni | 327/175 |
| 2003/0016766 A1 * | 1/2003 | Ito | 375/326 |
| 2004/0066876 A1 | 4/2004 | Tam | |
| 2005/0093600 A1 * | 5/2005 | Kwak | 327/161 |
| 2005/0127971 A1 * | 6/2005 | Hoff | 327/217 |
| 2006/0087354 A1 * | 4/2006 | Minzoni | 327/158 |
| 2006/0197565 A1 | 9/2006 | Kang | |

FOREIGN PATENT DOCUMENTS

JP    2004-129255    4/2004

(Continued)

OTHER PUBLICATIONS

Korean Notice of Allowance issued in Korean Patent Application No. KR 10-2006-0106765, dated Feb. 1, 2008.

*Primary Examiner*—Long Nguyen
*Assistant Examiner*—Sibin Chen
(74) *Attorney, Agent, or Firm*—IP & T Law Firm PLC

(57) ABSTRACT

A delay locked loop (DLL) of a semiconductor device includes: a first delay line for delaying a first clock signal in synchronization with a first edge of an external clock signal to output a first delayed clock signal; a second delay line for delaying a second clock signal in synchronization with a second edge of the external clock to output a second delayed clock signal; a duty cycle corrector (DCC) for mixing phases of the first and second delayed clock signals to output a DLL clock signal with a corrected duty cycle; and a DCC controller for disabling the duty cycle corrector in a section during which a phase difference between the first and second delayed clock signals is greater than a preset time after a delay locking.

26 Claims, 6 Drawing Sheets

FOREIGN PATENT DOCUMENTS

| | | |
|---|---|---|
| KR | 2001-94529 | 11/2001 |
| KR | 2003-90122 | 11/2003 |
| KR | 2003-90129 | 11/2003 |
| KR | 2004-20990 | 3/2004 |
| KR | 2004-37786 | 5/2004 |

* cited by examiner

UNKNOWN

DELAY LOCKED LOOP OF SEMICONDUCTOR DEVICE AND METHOD FOR DRIVING THE SAME

CROSS-REFERENCE TO RELATED APPLICATIONS

The present invention claims priority of Korean patent application number 10-2006-106765, filed on Oct. 31, 2006, which is incorporated by reference in its entirety.

BACKGROUND OF THE INVENTION

The present invention relates to a semiconductor device, and more particularly, to a delay locked loop (DLL) having a duty cycle corrector (DCC).

In synchronous semiconductor memory devices such as a double data rate (DDR) synchronous dynamic random access memory (SDRAM), data are transferred to other devices in synchronization with a DLL clock signal (CLK_DLL) generated by delaying an external clock signal (CLK_EXT) inputted from an external circuit such as a memory controller. Examples of a clock synchronization circuit include a phase locked loop (PLL) and a delay locked loop (DLL). The DLL is widely used in semiconductor devices because it has low noise and can be implemented in a small area compared with the PLL.

The trend of the SDRAM is changing from a single data rate (SDR) SDRAM to a DDR SDRAM. The DDR SDRAM outputs data in synchronization with both rising edges and falling edges of an external clock (CLK_EXT). Therefore, the duty cycle of the DLL clock signal (CLK_DLL) should be 50:50 in order to maximize a valid data window of an output data in the semiconductor device. If the duty cycle of the DLL clock signal (CLK_DLL) is not maintained at 50%, an error corresponding to an offset from 50% reduces a timing margin of a high-performance memory system. Meanwhile, as the semiconductor device operates faster, the incoming external clock signal (CLK_EXT) becomes distorted, leading to clock skew. Due to the clock skew in the duty cycle, the DLL may operate abnormally. Further, the duty cycle problem may occur in the DLL in itself. Consequently, a desired DLL clock signal (CLK_DLL) may not be outputted, which degrades performance of the semiconductor device. Hence, a correct duty cycle of the DLL clock signal (CLK_DLL) is a critical factor for stable operations of the semiconductor device.

Therefore, the semiconductor device includes a duty cycle corrector (DCC) that corrects the duty cycle of the DLL clock signal (CLK_DLL) to 50:50 when the incoming external clock signal is asymmetric, or the DLL clock signal (CLK_DLL) is asymmetrically generated because the duty cycle is distorted by internal operations.

FIG. 1 is a block diagram of a conventional DLL having a DCC.

Referring to FIG. 1, a conventional DLL includes first and second clock buffers 11 and 12, first and second delay lines 13 and 14, a DCC phase mixer 15, a dummy DCC phase mixer 16, first and second delay replica models 17 and 18, first and second phase comparators 19 and 20, and first and second delay controllers 21 and 22.

The first and second clock buffers 11 and 12 buffer an external clock signal CLK_EXT and an external clock bar signal CLK_EXTB to generate first and second reference clock signals CLK_REF and CLK_REFB, respectively. The first delay line 13 generates a first delayed clock signal CLK_D1 by delaying the first reference clock signal CLK_REF corresponding to the external-clock signal CLK_EXT in response to a first delay control signal D_CTR1, and the second delay line 14 generates a second delayed clock signal CLK_D2 by delaying the second reference clock signal CLK_REFB corresponding to the external clock bar signal CLK_EXTB in response to a second delay control signal D_CTR2. The first delayed clock signal CLK_D1 has information on a rising edge of the external clock signal CLK_EXT, and the second delayed clock signal CLK_D2 has information on a falling edge of the external clock signal CLK_EXT2.

The DCC phase mixer 15 mixes phases of the first and second delayed clock signals CLK_D1 and CLK_D2 to generate a DLL clock signal CLK_DLL with a duty cycle of exactly 50%. The dummy DCC phase mixer 16 has the same structure as the DCC phase mixer 15 and generates a clock signal with a duty cycle of 50%.

The first delay replica model 17 delays the output signal CLK_DLL of the DCC phase mixer 15 through delay elements located in a clock path to generate a first feedback clock signal CLK_FDB1. The second delay replica model 18 has the same structure as the first delay replica model 17 and delays the output signal of the dummy DCC phase mixer 16 to generate a second feedback clock signal CLK_FDB2.

The first phase comparator 19 compares a phase of the first reference clock signal CLK_REF with a phase of the first feedback clock signal CLK_FDB1, and the first delay controller 21 controls a delay amount of the first delay line 13 according to the result of comparison of the first phase comparator 19. The second phase comparator 20 compares a phase of the first reference clock signal CLK_REF with a phase of the second feedback clock signal CLK_FDB2, and the second delay controller 22 controls a delay amount of the second delay line 14 according to the result of comparison of the second delay controller 22.

FIGS. 2A to 2C are timing diagrams of the first and second delayed clock signals CLK_D1 and CLK_D2 and the DLL clock signal CLK_DLL.

Specifically, FIG. 2A is a timing diagram of the DLL clock signal CLK_DLL before the locking operation of the DLL. As can be seen from FIG. 2A, the duty cycle of the DLL clock signal CLK_DLL is distorted.

FIG. 2B is a timing diagram of the DLL clock signal CLK_DLL when the DCC phase mixer 15 and the dummy DCC phase mixer 16 operate after the locking operation of the DLL. For convenience, the DCC phase mixer 15 and the dummy DCC phase mixer 16 will be referred to as a duty cycle corrector (DCC).

In further detail, as illustrated in FIG. 1, the first 0and second delayed clock signals CLK_D1 and CLK_D2 in FIG. 2A are independently locked by the control of the first and second delay lines 13 and 14, respectively. After the locking operation, the first and second delayed clock signals CLK_D1 and CLK_D2 coincide with each other at the rising edge and their duty cycles are opposite to each other, as illustrated in FIG. 2B. The DCC mixes the phase of the falling edge of the first delayed clock signal CLK_D1 and the phase of the falling edge of the second delayed clock signal CLK_D2 to generate the DLL clock signal CLK_DLL with a duty cycle of exactly 50%.

FIG. 2C is a timing diagram of the signals when a voltage bump phenomenon occurs, that is, a level of an external voltage (VDD) abruptly changes due to external and/or internal factors. As described above, the clock signals pass through the first and second delay lines 13 and 14 to generate the first and second delayed clock signals CLK_D1 and CLK_D2, respectively. In other words, since the first and second delayed clock signals CLK_D1 and CLK_D2 of FIG.

2B are generated through a different number of unit delays, their delay amounts are different from each other according to the external voltage (VDD). The unit delay is implemented using a NAND gate and its delay time changes according to the external voltage (VDD). For example, the delay time of the unit delay decreases when the external voltage (VDD) is high, while it increases when the external voltage (VDD) is low.

In the serious cases, as illustrated in FIG. 2C, the first and second delayed clock signals CLK_D1 and CLK_D2, which are delay-locked through a different number of unit delays, may have phases opposite to each other according to a voltage bump phenomenon. In this case, the duty cycle of the DLL clock signal CLK_DLL becomes worse or disappears and the DLL clock signal CLK_DLL becomes an unknown-state signal. Even though the DLL resumes the locking operation, a normal locking operation cannot be achieved-because the DLL clock-signal CLK_DLL disappears. Consequently, this leads to a defective semiconductor device.

SUMMARY OF THE INVENTION

Embodiments of the present invention are directed to providing a DLL of a semiconductor device, which can prevent a duty cycle of a delay locked loop (DLL) clock signal from being worse or disappearing due to a voltage bump of an external voltage.

Another embodiments of the present invention are directed to providing a DLL of a semiconductor device, which can prevent a locking fail that has been derived from a DLL clock signal output from a duty cycle corrector (DCC).

In accordance with an aspect of the present invention, there is provided a delay locked loop (DLL) of a semiconductor device, including: a first delay line for delaying a first clock signal in synchronization with a first edge of an external clock signal to output a first delayed clock signal; a second delay line for delaying a second clock signal in synchronization with a second edge of the external clock to output a second delayed clock signal; a duty cycle corrector (DCC) for mixing phases of the first and second delayed clock signals to output a DLL clock signal with a corrected duty cycle; and a DCC controller for disabling the duty cycle corrector in a section during which a phase difference between the first and second delayed clock signals is greater than a preset time after a delay locking.

In accordance with another aspect of the present invention, there is provided a delay locked loop (DLL) of a semiconductor device, including: a first delay line for delaying a first clock signal in synchronization with a first edge of an external clock to output a first delayed clock signal; a second delay line for delaying a second clock signal in synchronization with a second edge of the external clock signal to output a second delayed clock signal; a duty cycle corrector (DCC) for mixing phases of the first and second delayed clock signals to output a DLL clock signal with a corrected duty cycle; a DCC controller for controlling the duty cycle corrector by generating a DCC off signal based on the first and second delayed clock signals.

In accordance with still another aspect of the present invention, there is provided a method for driving a delay locked loop (DLL), including: delaying a first clock signal in synchronization with a first edge of an external clock signal to generate a first delayed clock signal; delaying a second clock signal in synchronization with a second edge of an external clock signal to generate a second delayed clock signal; correcting a duty cycle by mixing phases of the first and second delayed clock signals to output a DLL clock signal with a corrected duty cycle; and controlling the correcting of the duty cycle by generating a DCC off signal based on the first and second delayed clock signals.

DESCRIPTION OF SPECIFIC EMBODIMENTS

Hereinafter, a delay locked loop (DLL) having a duty cycle corrector (DCC) in accordance with exemplary embodiments of the present invention will be described in detail with reference to the accompanying drawings.

Figure 3:
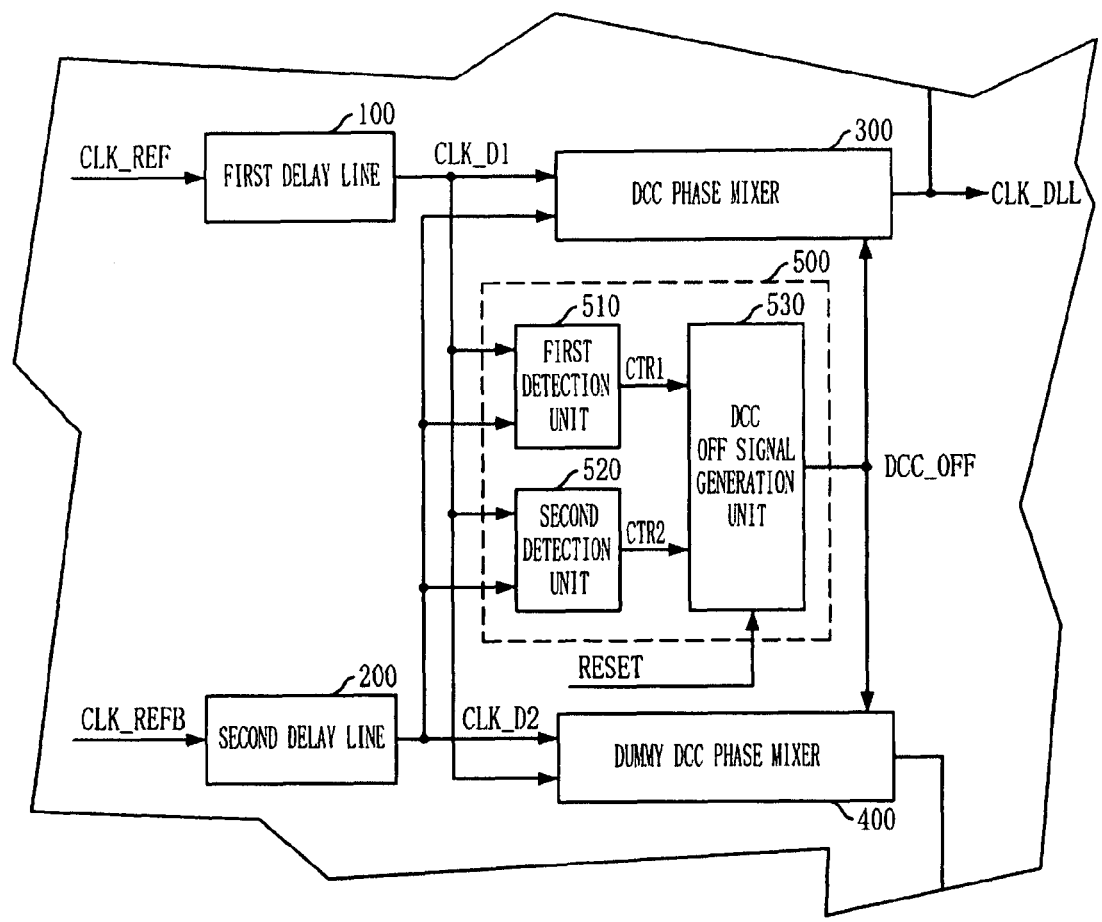
FIG. 3 is a block diagram of a DLL in accordance with an embodiment of the present invention.

FIG. 3 is a block diagram of a DLL in accordance with an embodiment of the present invention.

Referring to FIG. 3, the DLL includes first and second delay lines 100 and 200, a DCC phase mixer 300, a dummy DCC phase mixer 400, and a DCC controller 500.

Figure 1:
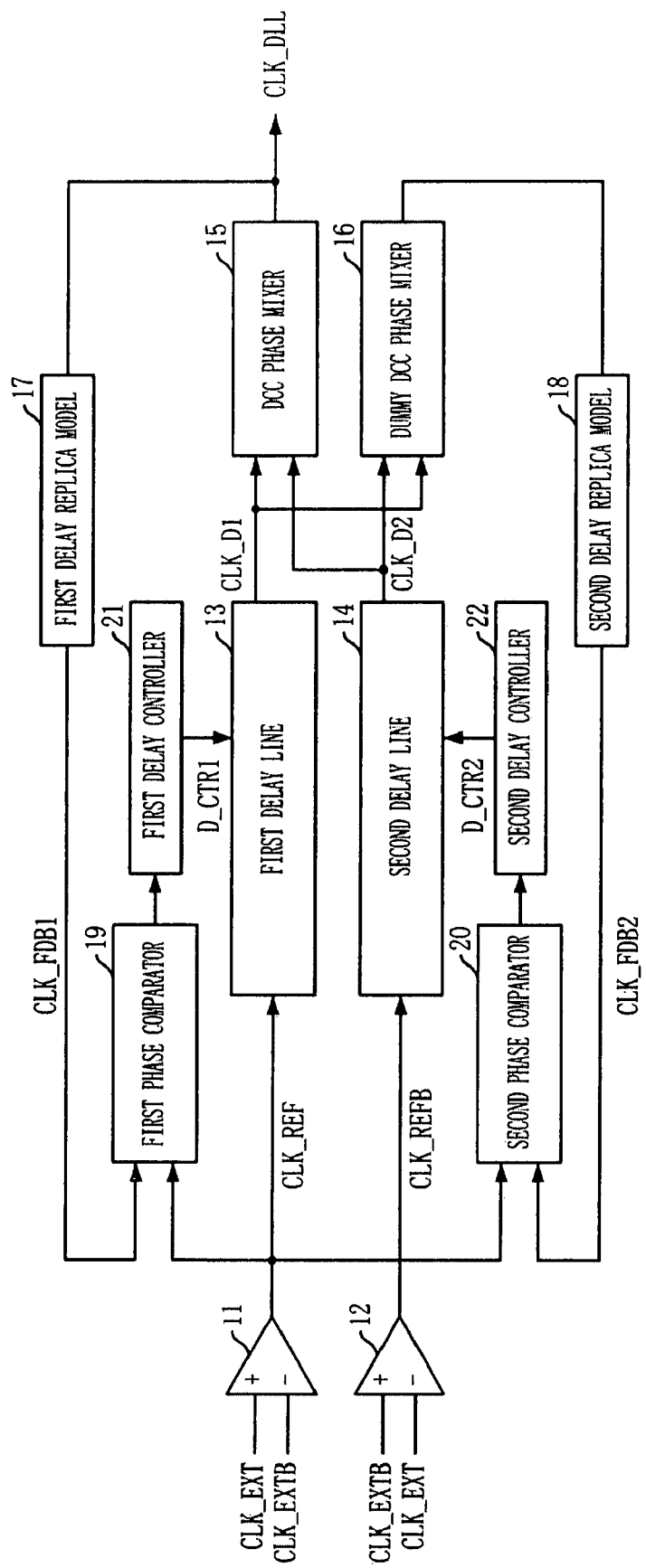
FIG. 1 is a block diagram of a conventional DLL having a DCC.

The DLL in accordance with the embodiment of the present invention is different from the conventional DLL of FIG. 1 in that the DCC controller 500 is further included, but the first and second clock buffers 11 and 12, the first and second delay replica models 17 and 18, the first and second phase comparators 19 and 20, and the first and second delay controllers 21 and 22 are omitted. Further, the technical implementation and operation of the first and second delay lines 100 and 200 are substantially equal to those of the related art. The DCC controller 500 ensures stable operations of the DCC phase mixer 300 and the dummy DCC phase mixer 400.

Referring to FIG. 3, the first delay line 100 generates a first delayed clock signal CLK_D1 by delaying a first reference clock signal CLK_REF having information on a rising edge of an external clock signal CLK_EXT, and the second delay line 200 generates a second delayed clock signal CLK_D2 by delaying a second reference clock signal CLK_REFB having information on a falling edge of the external clock signal CLK_EXT.

The DCC phase mixer 300 and the dummy DCC phase mixer 400 mix phases of the first and second delayed clock signals CLK_D1 and CLK_D2 to output a DLL clock signal CLK_DLL with a corrected duty cycle. The DCC phase mixer 300 and the dummy DCC phase mixer 400 are turned on/off in response to a DCC off signal DCC_OFF.

After a delay locking operation of the DLL, the DCC controller 500 activates the DCC off signal DCC_OFF in a section where a phase difference between the first and second delayed clock signals CLK_D1 and CLK_D2 is greater than a preset time. The activated state of the DCC off signal DCC_OFF represents a state that is set to disable the DCC phase mixer 300 and the dummy DCC phase mixer 400. For example, the DCC phase mixer 300 and the dummy DCC phase mixer 400 are disabled when the DCC off signal DCC_OFF is activated to a logic high level, and it is enabled when the DCC off signal DCC_OFF is deactivated to a logic low level.

The DCC controller 500 includes a first detection unit 510, a second detection unit 520, and a DCC off signal generation unit 530. Their detailed description will be made below with reference to FIGS. 4 to 7.

Figure 4:
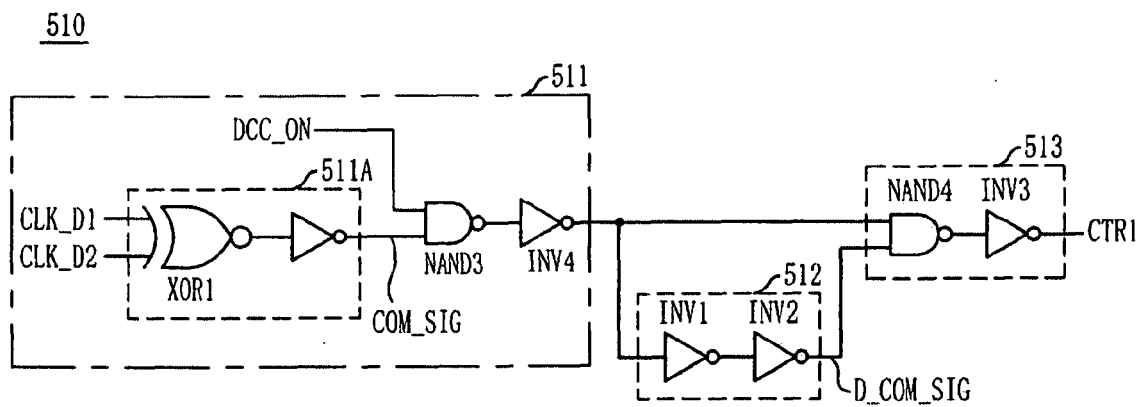
FIG. 4 is a circuit diagram of a first detection unit illustrated in FIG. 3.

FIG. 4 is a circuit diagram of the first detection unit 510 illustrated in FIG. 3.

Referring to FIG. 4, after the delay locking operation, the first detection unit 510 detects whether the phase difference between the first and second delayed clock signals CLK_D1 and CLK_D2 is greater than the preset time. The first detection unit 510 includes a first comparing circuit 511, a first delay unit 512, and a first control signal output circuit 513. The first comparing circuit 511 compares the first delayed clock signal CLK_D1 with the second delayed clock signal CLK_D2 in response to a DCC on signal DCC_ON. The first delay unit 512 delays an output signal of the first comparing circuit 511 by the preset time to thereby output a delayed comparison signal D_COM_SIG. The first control signal output circuit 513 receives the output signal of the first comparing circuit 511 and the delayed comparison signal D_COM_SIG to output a first control signal CTR1 for setting the DCC off signal DCC_OFF. The setting of the DCC off signal DCC_OFF represents that the DCC 300 and 400 are disabled so that it performs no DCC operation.

The first comparing circuit 511 includes an input unit 511A, a first NAND gate NAND3, and a first inverter INV4. The input unit includes an XOR gate XOR1 configured to receive the first and second delayed clock signals CLK_D1 and CLK_D2. The first NAND gate NAND3 is configured to receive the DCC on signal DCC_ON and the comparison signal COM_SIG after the delay locking operation. The DCC on signal DCC_ON is a signal for enabling the DCC phase mixer 300 and the dummy DCC phase mixer 400. The first inverter INV4 is configured to invert an output signal of the first NAND gate NAND3. Accordingly, the first comparing circuit 511 compares the first delayed clock signal CLK_D1 with the second delayed clock signal CLK_D2 through the XOR gate XOR1. If the logic level of the first delayed clock signal CLK_D1 is equal to that of the second delayed clock signal CLK_D2, the output signal of the first comparing circuit 511 is a logic low level. If not equal, the output signal of the first comparing circuit 511 is a logic high level.

The first delay unit 512 delays the output signal of the first comparing circuit 511 by a preset time defined by second and third inverters INV1 and INV2 to output the delayed comparison signal D_COM_SIG. The purpose of the first delay unit 512 is to provide a margin with respect to a phase difference between the first and second delayed clock signals CLK_D1 and CLK_D2. The preset time can be changed according to the configuration of the first delay unit 512.

The first control signal output circuit 513 includes a second NAND gate NAND4 and a fourth inverter INV3. The second NAND gate NAND4 is configured to receive the output signal of the first comparing circuit 511 and the delayed comparison signal D_COM_SIG, and the fourth inverter INV3 is configured to invert an output signal of the second NAND gate NAND4. The first control signal output circuit 513 outputs the first control signal CTR1 according to the phases of the comparison signal COM_SIG and the delayed comparison signal D_COM_SIG. For example, when the phase difference between the first and second delayed clock signals CLK_D1 and CLK_D2 is out of a predetermined range of the preset time, the first control signal CTR1 becomes a pulse that is activated to a logic high level.

Figure 5:
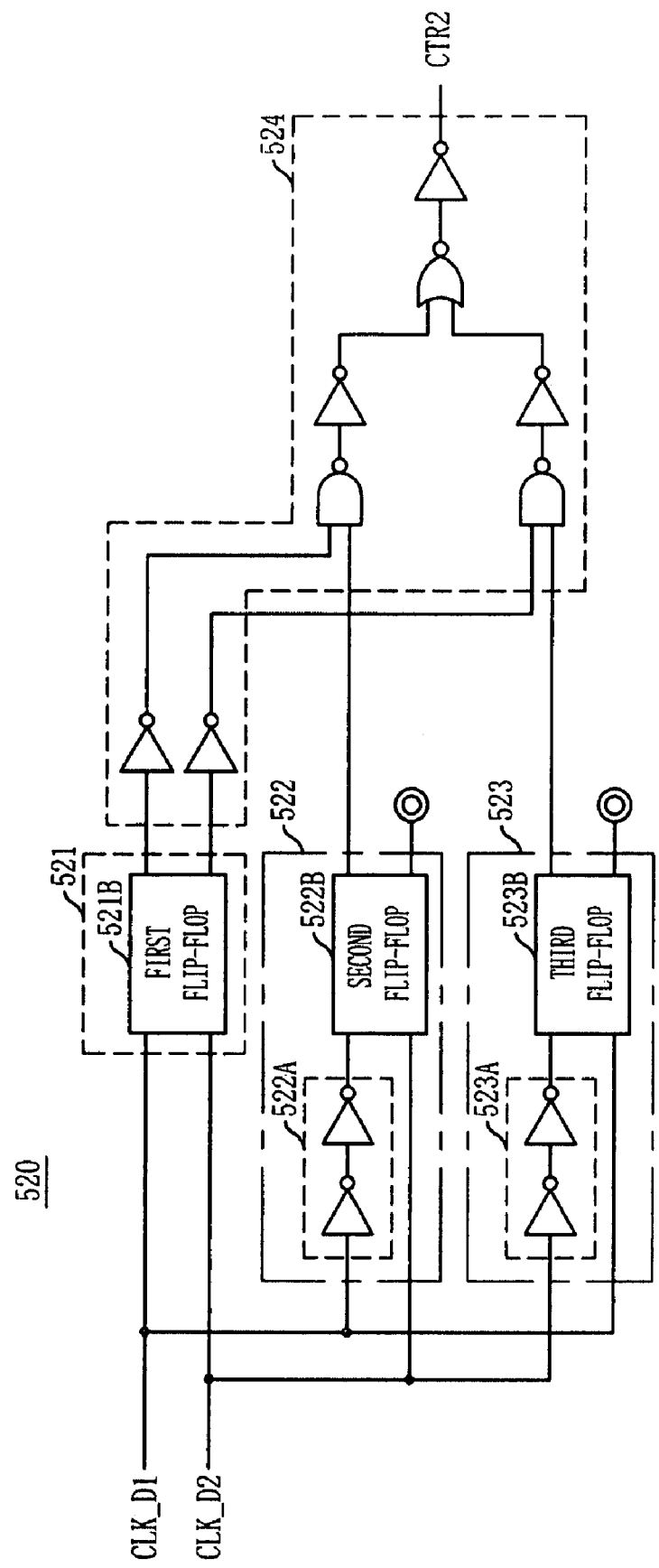
FIG. 5 is a circuit diagram of a second detection unit illustrated in FIG. 3.

FIG. 5 is a circuit diagram of the second detection unit 520 illustrated in FIG. 3.

Referring to FIG. 5, the second detection unit 520 detects whether the phase difference between the first and second delayed clock signals CLK_D1 and CLK_D2 is less than the preset time. The second detection unit 520 includes a second comparing circuit 521, a third comparing circuit 522, a fourth comparing circuit 523, and a second control signal output circuit 524. The second comparing circuit 521 compares the first delayed clock signal CLK_D1 with the second delayed clock signal CLK_D2. The third comparing circuit 522 compares the second delayed clock signal CLK_D2 with a signal generated by delaying the first delayed clock signal CLK_D1 by the same delay time as that of the first delay unit 512 of FIG. 4. The fourth comparing circuit 523 compares the first delayed clock signal CLK_D1 with a signal generated by delaying the second delayed clock signal by the same delay time as that of the first delay unit 512 of FIG. 4. The second control signal output circuit 524 receives an output signal of the second comparing circuit 521, an output signal of the third comparing circuit 522, and an output signal of the fourth comparing circuit 523 to output a second control signal CTR2 for resetting the DCC off signal DCC_OFF. The resetting of the DCC off signal DCC_OFF represents that the DCC phase mixer 300 and the dummy DCC phase mixer 400 are enabled so that they perform the DCC operation.

Each of the second comparing circuit 521, the third comparing circuit 522, and the fourth comparing circuit 523 includes first to third flip-flops 521B to 523B, respectively.

Figure 6:
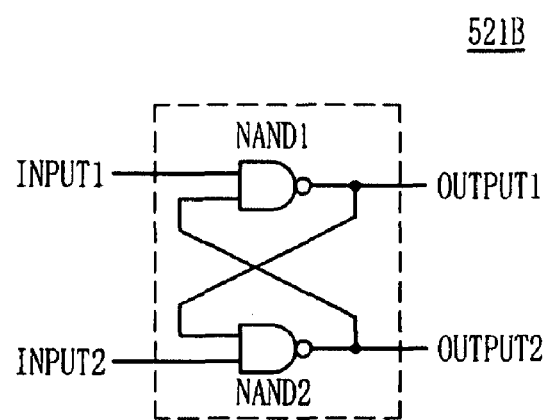
FIG. 6 is a circuit diagram of a flip-flop illustrated in FIG. 5.

FIG. 6 is a circuit diagram of the first to third flip-flops 521B to 523B included in the respective comparator circuits 521, 522 and 523. For convenience, the first flip-flip 521B of the second comparing circuit 521 is illustrated in FIG. 6.

Referring to FIG. 6, the first flip-flop 521B includes a first NAND gate NAND1 and a second NAND gate NAND2. The first NAND gate NAND1 has an input terminal INPUT1 and the second NAND gate NAND2 has an input terminal INPUT2. An output terminal of the first NAND gate NAND1 is connected to another input terminal of the second NAND gate NAND2, and an output terminal of the second NAND gate NAND2 is connected to another input terminal of the first NAND gate NAND1.

Figure 2A:
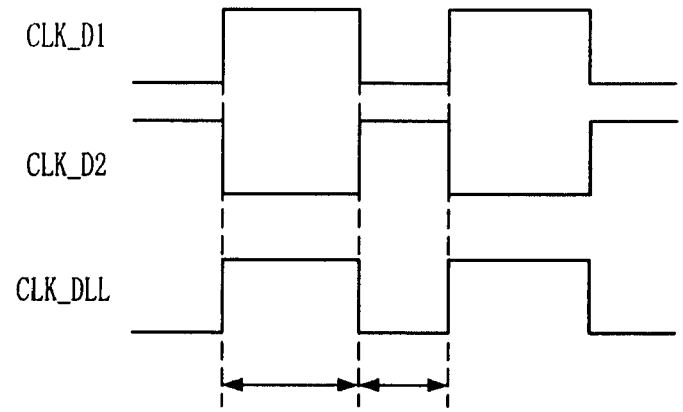
FIGS. 2A to 2C are timing diagrams of a first delayed clock signal, a second delayed clock signal, and a DLL clock signal.
Figure 2B:
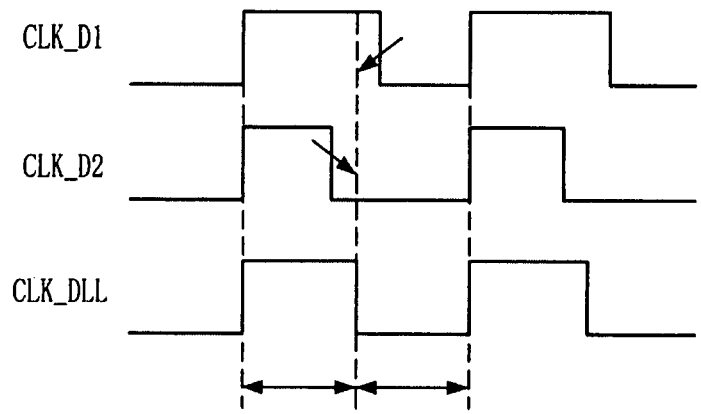
Figure 2C:
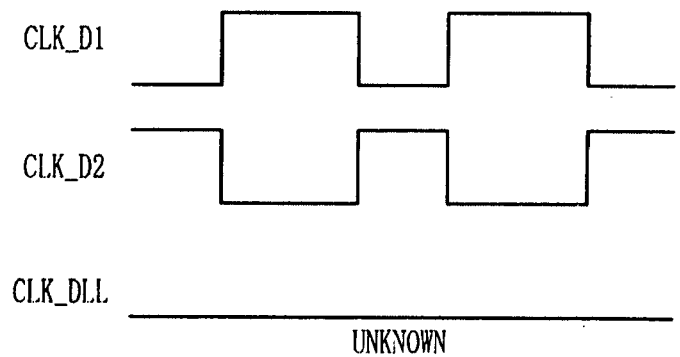

Referring again to FIG. 5, the second comparing circuit 521 has the first flip-flop 521B including a first input terminal INPUT1 receiving the first delayed clock signal CLK_D1, and a second input terminal INPUT2 receiving the second delayed clock signal CLK_D2. The third comparing circuit 522 includes a second delay 522A and a second flip-flop 522B. The second delay 522A provides a margin time to the first delayed clock signal CLK_D1, and the second flip-flop 522B compares an output signal of the second delay 522A with the second delayed clock signal CLK_D2. The second flip-flop 522B has a first input terminal INPUT1 receiving the output signal of the second delay 522A, and a second input terminal INPUT2 receiving the second delayed clock signal CLK_D2. The fourth comparing circuit 523 includes a third delay 523A and a third flip-flop 523B. The third delay 523A provides a margin time to the second delayed clock signal CLK_D2, and the third flip-flop 523B compares an output signal of the third delay 523A and the first delayed clock signal CLK_D1. The third flip-flop 523B has a first input terminal INPUT1 receiving an output signal of the third delay 523A, and a second input terminal INPUT2 receiving the first delayed clock signal CLK_D1. In this embodiment, each of the second delay 522A and the third delay 523A includes two inverters in order to have the same delay time as that of the first delay unit 512 illustrated in FIG. 2.

The second control signal output circuit 524 receives output signals from the first and second output terminals OUTPUT1 and OUTPUT2 of the first flip-flop 521B of the second comparing circuit 521, an outputted signal from the first output terminal OUTPUT1 of the second flip-flop 522B of the third comparing circuit 522, and an outputted signal from the first output terminal OUTPUT1 of the third flip-flop 523B of the fourth comparing circuit 523, and outputs the second control signal CTR2. For example, when the phase difference between the first and second delayed clock signals CLK_D1 and CLK_D2 falls within the margin time, the second control signal CTR2 maintains a logic high level.

Figure 7:
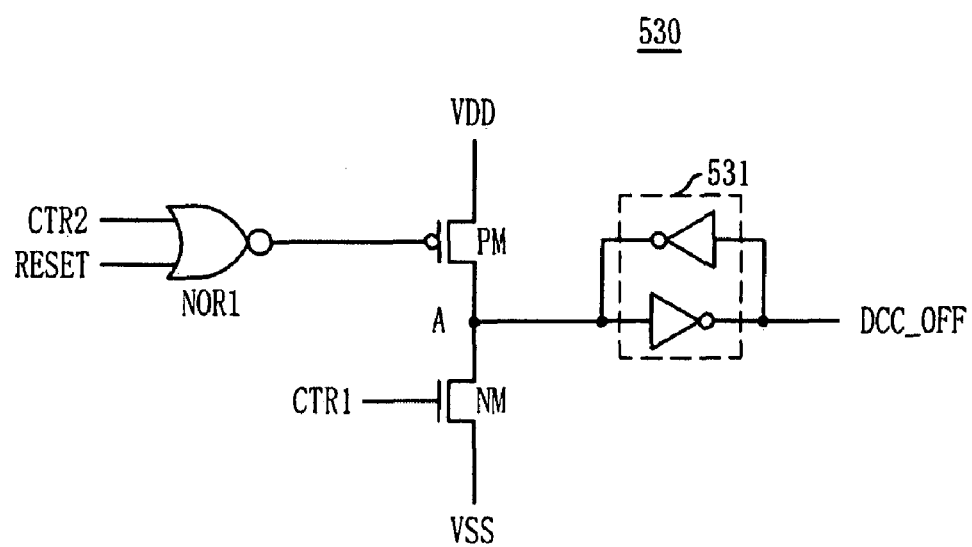
FIG. 7 is a circuit diagram of a DCC off signal generation unit illustrated in FIG. 3.

FIG. 7 is a circuit diagram of the DCC off signal generation unit 530 illustrated in FIG. 3.

Referring to FIG. 3, the DCC off signal generation unit 530 for generating the DCC off signal DCC_OFF includes a NOR gate NOR1, a PMOS transistor PM, an NMOS transistor NM, and a latch 531. The NOR gate NOR1 is configured to receive the second control signal CTR2 and a reset signal RESET for resetting the DCC off signal generation unit 530. The PMOS transistor PM has a source connected to the external voltage terminal VDD, a drain connected to a node A, and a gate receiving an output signal of the NOR gate NOR1. The NMOS transistor NM has a source connected to the node A, a drain connected to a ground voltage terminal VSS, and a gate receiving the first control signal CTR1. The latch 531 latches a signal applied to the node A.

When the DCC off signal DCC_OFF becomes a logic high level, the DCC phase mixer 300 and the dummy DCC phase mixer 400 are disabled to stop their operation. When the DCC off signal DCC_OFF becomes a logic low level, the DCC phase mixer 300 and the dummy DCC phase mixer 400 are enabled to perform the DCC operation.

Figure 8A:
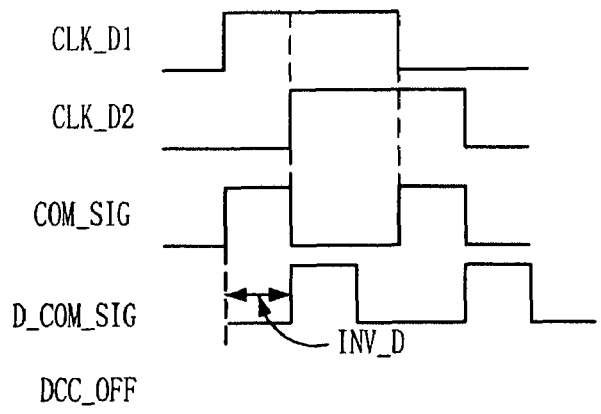
FIGS. 8A to 8C are timing diagrams of the signals used in the DLL in accordance with the embodiment of the present invention.
Figure 8B:
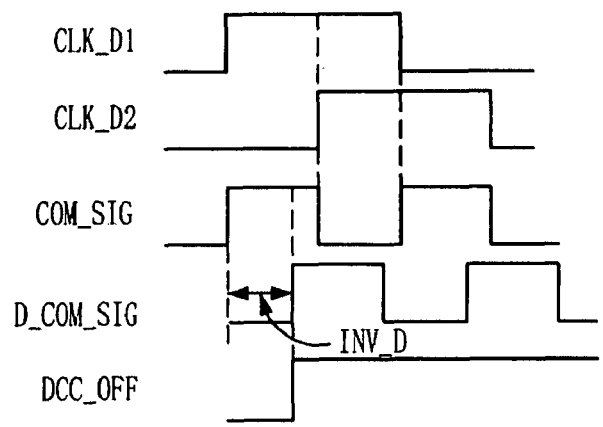
Figure 8C:
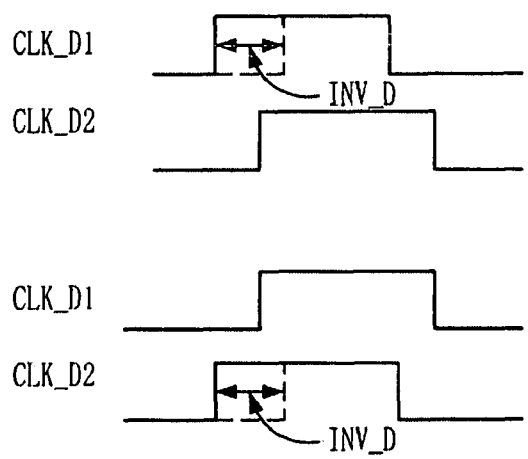

FIGS. 8A to 8C are timing diagrams of the signals used in the DLL in accordance with an embodiment of the present invention.

Referring to FIG. 8A, when the phase difference between the first and second delayed clock signals CLK_D1 and CLK_D2 is less than the preset time INV_D given by two inverters, the second detection unit 520 generates the second control signal CTR2 of a logic high level and the DCC off signal DCC_OFF maintains a logic low level. Hence, the DCC phase mixer 300 and the dummy DCC phase mixer 400 continue to perform the DCC operation.

Referring to FIG. 8B, when the phase difference between the first and second delayed clock signals CLK_D1 and CLK_D2 is greater than the preset time INV_D given by two inverters, the first detection unit 510 generates the first control signal CTR1 that is a pulse signal activated to a logic high level, and the DCC off signal DCC_OFF becomes a logic high level. Hence, the DCC phase mixer 300 and the dummy DCC phase mixer 400 stops the DCC operation.

FIG. 8C illustrates a section during which the DCC off signal DCC_OFF maintains a logic low level, that is, the DCC phase mixer 300 and the dummy DCC phase mixer 400 continue to perform the DCC operation.

Referring to FIG. 8C, a first case is that the first delayed clock signal CLK_D1 leads the second delayed clock signal CLK_D2, and a second case is that the first delayed clock signal CLK_D1 lags the second delayed clock signal CLK_D2. In the two cases, the phase difference between the first and second delayed clock signals CLK_D1 and CLK_D2 is less than the preset time INV_D. In other words, the phase difference occurs due to the voltage bump after the delay locking of the first and second delayed clock signals CLK_D1 and CLK_D2. Since the phase difference is less than the preset time INV_D given by two inverters, the DCC off signal DCC_OFF maintains a logic low level, so that the DCC operation is kept on.

The DLL in accordance with the embodiment of the present invention delays the external clock signal CLK_EXT to generate the first and second delayed clock signals CLK_D1 and CLK_D2, and mixes the phases of the first and second delayed clock signals CLK_D1 and CLK_D2 to generate the DLL clock signal CLK_DLL, a duty cycle of which is corrected to 50%. When the phase difference between the first and second delayed clock signal CLK_D1 and CLK_D2 is greater than the preset time after the delay locking, the DCC off signal DCC_OFF is enabled and thus the DCC phase mixer 300 and the dummy DCC phase mixer 400 stop the DCC operation.

While the conventional DLL does not perform the normal locking operation because the DLL clock signal CLK_DLL disappears due to the phase difference between the first and second delayed clock signals CLK_D1 and CLK_D2, the DLL in accordance with the embodiment of the present invention can determine whether to perform the DCC operation by detecting the phase difference between the first and second delayed clock signals CLK_D1 and CLK_D2 with the sufficient margin. Therefore, the DCC operation is stopped in the section during which the phase difference between the first and second delayed clock signals CLK_D1 and CLK_D2 is greater than the preset time, and it is resumed after the locking operation.

In accordance with the embodiment of the present invention, the DLL stably controls the DCC phase mixer 300 and the dummy DCC phase mixer 400 using the DCC controller 500, thereby preventing the duty cycle of the DLL clock signal CLK_DLL from being worse or disappearing due to the voltage bump.

As described above, the stable DCC clock signal CLK_DCC is generated by controlling the DCC operation of the DCC according to the situations. Consequently, even in the locking fail, the DLL clock signal can be re-locked, thereby obtaining a more reliable DLL operation.

While the present invention has been described with respect to the specific embodiments, it will be apparent to those skilled in the art that various transpositions, changes, and modifications may be made without departing from the spirit and scope of the invention as defined in the following claims.

What is claimed is:

1. A delay locked loop (DLL) of a semiconductor device, comprising:
    a first delay line for delaying a first clock signal in synchronization with a first edge of an external clock signal to output a first delayed clock signal;
    a second delay line for delaying a second clock signal in synchronization with a second edge of the external clock to output a second delayed clock signal;
    a duty cycle corrector (DCC) for mixing phases of the first and second delayed clock signals to output a DLL clock signal with a corrected duty cycle, wherein the DCC includes a first phase mixer for mixing the phases of the first and second delayed clock signals to output the DLL clock signal and a second phase mixer for mixing the phases of the first and second delayed clock signals to output a second phase mixer clock signal; and
    a DCC controller for receiving the first and second delayed clock signals and for disabling both the mixing of the phases of the first and second delayed clock signals by the first phase mixer and the mixing of the phases of the first and second delayed clock signals by the second phase mixer in response to a determination that a phase difference between the first and second delayed clock signals is greater than a preset time.

2. The DLL as recited in claim 1, wherein the first delayed clock signal comprises information on a rising edge of the external clock signal.

3. The DLL as recited in claim 1, wherein the second delayed clock signal comprises information on a falling edge of the external clock signal.

4. A delay locked loop (DLL) of a semiconductor device, comprising:
 a first delay line for delaying a first clock signal in synchronization with a first edge of an external clock to output a first delayed clock signal;
 a second delay line for delaying a second clock signal in synchronization with a second edge of the external clock signal to output a second delayed clock signal;
 a duty cycle corrector (DCC) for mixing phases of the first and second delayed clock signals to output a DLL clock signal with a corrected duty cycle, wherein the DCC includes a first phase mixer for mixing the phases of the first and second delayed clock signals to output the DLL clock signal and a second phase mixer for mixing the phases of the first and second delayed clock signals to output a second phase mixer clock signal;
 a DCC controller for controlling the DCC by generating a DCC off signal based on the first and second delayed clock signals after a delay locking,
 wherein both the mixing of the phases of the first and second delayed clock signals by the first phase mixer and the mixing of the phases of the first and second delayed clock signals by the second phase mixer are disabled in response to the DCC off signal and the DCC off signal is generated in response to a determination that a phase difference between the first and second delayed clock signals is greater than a preset time.

5. The DLL as recited in claim 4, wherein the DCC controller includes:
 a first detection unit for detecting whether a phase difference between the first and second delayed clock signals is greater than a preset time after a delay locking and outputting a first control signal;
 a second detection unit for detecting whether a phase difference between the first and second delayed clock signals is less than the preset time after the delay locking and outputting a second control signal; and
 a DCC off signal generation unit for generating the DCC off signal in response to the first and second control signals to disable the DCC.

6. The DLL as recited in claim 5, wherein the first detection unit comprises:
 a first comparing circuit for comparing the first delayed clock signal with the second delayed clock signal in response to a DCC on signal;
 a first delay circuit for delaying an output signal of the first comparing circuit by the preset time; and
 a first control signal output circuit for receiving the output signal of the first comparing circuit and an output signal of the first delay circuit to output the first control signal for setting the DCC off signal.

7. The DLL as recited in claim 6, wherein the first comparing circuit comprises:
 an XOR gate configured to compare the first delayed clock signal with the second delayed clock signal;
 a NAND gate configured to receive the DCC on signal and an output signal of the XOR gate; and
 an inverter configured to invert an output signal of the NAND gate.

8. The DLL as recited in claim 6, wherein the first delay circuit comprises at least one delay element.

9. The DLL as recited in claim 6, wherein the second detection unit comprises:
 a second comparing circuit for comparing the first delayed clock signal with the second delayed clock signal;
 a third comparing circuit for comparing the second delayed clock signal with a signal generated by delaying the first delayed clock signal by the preset time;
 a fourth comparing circuit for comparing the first delayed clock signal with a signal generated by delaying the second delayed clock signal by the preset time; and
 a second control signal output circuit for receiving output signals of the second and fourth comparator circuits to output the second control signal for resetting the DCC off signal.

10. The DLL as recited in claim 9, wherein the second comparing circuit comprises a first flip-flop having a first input terminal receiving the first delayed clock signal, and a second input terminal receiving the second delayed clock signal.

11. The DLL as recited in claim 10, wherein the third comparing circuit comprises:
 a second delay circuit for delaying the first delayed clock signal by the preset time; and
 a second flip-flop having a first input terminal receiving an output signal of the second delay circuit, and a second input terminal receiving the second delayed clock signal.

12. The DLL as recited in claim 11, wherein the second delay circuit comprises at least one delay element.

13. The DLL as recited in claim 11, wherein the fourth comparing circuit comprises:
 a third delay circuit for delaying the second delayed clock signal by the preset time; and
 a third flip-flop having a first input terminal receiving an output signal of the third delay circuit, and a second input terminal receiving the first delayed clock signal.

14. The DLL as recited in claim 13, wherein the third delay circuit comprises at least one delay element.

15. The DLL as recited in claim 11, wherein each of the first to third flip-flop comprises:
 a first NAND gate having one terminal connected to the first input terminal; and
 a second NAND gate having one terminal connected to the second input terminal, another terminal connected to an output terminal of the first NAND gate, and an output terminal connected to another terminal of the first NAND gate.

16. The DLL as recited in claim 9, wherein the DCC off signal generation unit comprises:
 an output terminal;
 a NOR gate configured to receive the second control signal and a reset signal for resetting an operation of the DCC off signal generation unit;
 a first switch connected between the output terminal and a first voltage terminal, for performing an operation in response to an output signal of the NOR gate; and
 a second switch connected between the output terminal and a second voltage terminal, for performing an operation in response to the first control signal.

17. The DLL as recited in claim 16, wherein the DCC off signal generation unit further comprises a latch for latching an output signal of the output terminal.

18. The DLL as recited in claim 16, wherein the first voltage is an external voltage and the second voltage is a ground voltage.

19. The DLL as recited in claim 4, wherein the first delayed clock signal comprises information on a rising edge of the external clock signal.

20. The DLL as recited in claim 4, wherein the second delayed clock signal comprises information on a falling edge of the external clock signal.

21. A method for driving a delay locked loop (DLL), comprising:
 delaying a first clock signal in synchronization with a first edge of an external clock signal to generate a first delayed clock signal;
 delaying a second clock signal in synchronization with a second edge of an external clock signal to generate a second delayed clock signal;
 correcting a duty cycle by using a first phase mixer to mix phases of the first and second delayed clock signals to output a DLL clock signal with a corrected duty cycle,
 mixing the phases of the first and second delayed clock signals using a second phase mixer in order to produce a second phase mixer clock signal; and
 controlling the correcting of the duty cycle by generating a duty cycle corrector (DCC) off signal based on the first and second delayed clock signals after a delay locking,
 wherein both the mixing of the phases of the first and second delayed clock signals by the first phase mixer and the mixing of the phases of the first and second delayed clock signals by the second phase mixer are disabled in response to a determination that a phase difference between the first and second delayed clock signals is greater than a preset time.

22. The method as recited in claim 21, wherein the controlling the correcting of the duty cycle includes:
 outputting a first control signal by detecting whether a phase difference between the first and second delayed clock signals is greater than a preset time after a delay locking;
 outputting a second control signal by detecting whether a phase difference between the first and second delayed clock signals is less than the preset time after the delay locking;
 generating the DCC off signal in response to the first and second control signals; and
 controlling the correcting of the duty cycle in response to the DCC off signal.

23. The method as recited in claim 22, wherein the outputting the first control signal includes:
 comparing the first delayed clock signal with the second delayed clock signal;
 delaying the result of comparison by the preset time; and
 outputting the first control signal for setting the DCC off signal based on the comparison result and the delayed comparison result.

24. The method as recited in claim 23, wherein the outputting the second control signal includes:
 comparing the first delayed clock signal with the second delayed clock signal;
 comparing the second delayed clock signal with a signal generated by delaying the first delayed clock signal by the preset time;
 comparing the first delayed clock signal with a signal generated by delaying the second delayed clock signal by the preset time; and
 outputting the second control signal for resetting the DCC off signal based on the comparison results.

25. The method as recited in claim 21, wherein the first delayed clock signal comprises information on a rising edge of the external clock signal.

26. The method as recited in claim 21, wherein the second delayed clock signal comprises information on a falling edge of the external clock signal.

* * * * *